(12) United States Patent
Iinuma

(10) Patent No.: US 7,372,108 B2
(45) Date of Patent: May 13, 2008

(54) SEMICONDUCTOR DEVICE AND MANUFACTURING METHOD THEREOF

(75) Inventor: Toshihiko Iinuma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 153 days.

(21) Appl. No.: 11/340,517

(22) Filed: Jan. 27, 2006

(65) Prior Publication Data
US 2007/0066001 A1    Mar. 22, 2007

(30) Foreign Application Priority Data
Sep. 16, 2005    (JP)    ............................. 2005-270773

(51) Int. Cl.
*H01L 29/76* (2006.01)

(52) U.S. Cl. ............... 257/369; 257/384; 257/E27.062; 257/E29.116

(58) Field of Classification Search ................ 257/369, 257/382, 384, 757, 770, E27.062, E29.116
See application file for complete search history.

(56) References Cited

U.S. PATENT DOCUMENTS

| 6,982,465 B2 * | 1/2006 | Kumagai et al. ........... 257/369 |
| 2003/0040158 A1 * | 2/2003 | Saitoh ........................ 438/279 |
| 2006/0163670 A1 * | 7/2006 | Ellis-Monaghan et al. .. 257/388 |
| 2006/0180866 A1 * | 8/2006 | Zhu et al. .................... 257/368 |
| 2007/0018252 A1 * | 1/2007 | Zhu ............................ 257/369 |

FOREIGN PATENT DOCUMENTS

| JP | 2003-60076 | 2/2003 |
| JP | 2005-57301 | 3/2005 |

* cited by examiner

*Primary Examiner*—Zandra V. Smith
*Assistant Examiner*—Toniae M Thomas
(74) *Attorney, Agent, or Firm*—Finnegan, Henderson, Farabow, Garrett & Dunner, L.L.P.

(57) ABSTRACT

The present invention discloses a semiconductor device and a manufacturing method thereof which improves its characteristics even though it is miniaturized. According to one aspect of the present invention, it is provided a semiconductor device comprising a first semiconductor element device including a pair of first diffusion layers formed in the semiconductor substrate with a first gate electrode therebetween, and a first conductor layer formed in the first diffusion layer and having an internal stress in a first direction, and a second semiconductor element device including a pair of second diffusion layers formed in the semiconductor substrate with a second gate electrode therebetween, and a second conductor layer formed in the second diffusion layer, having an internal stress in a second direction opposite to the first direction, and constituted of the same element as that of the first conductor layer.

9 Claims, 6 Drawing Sheets

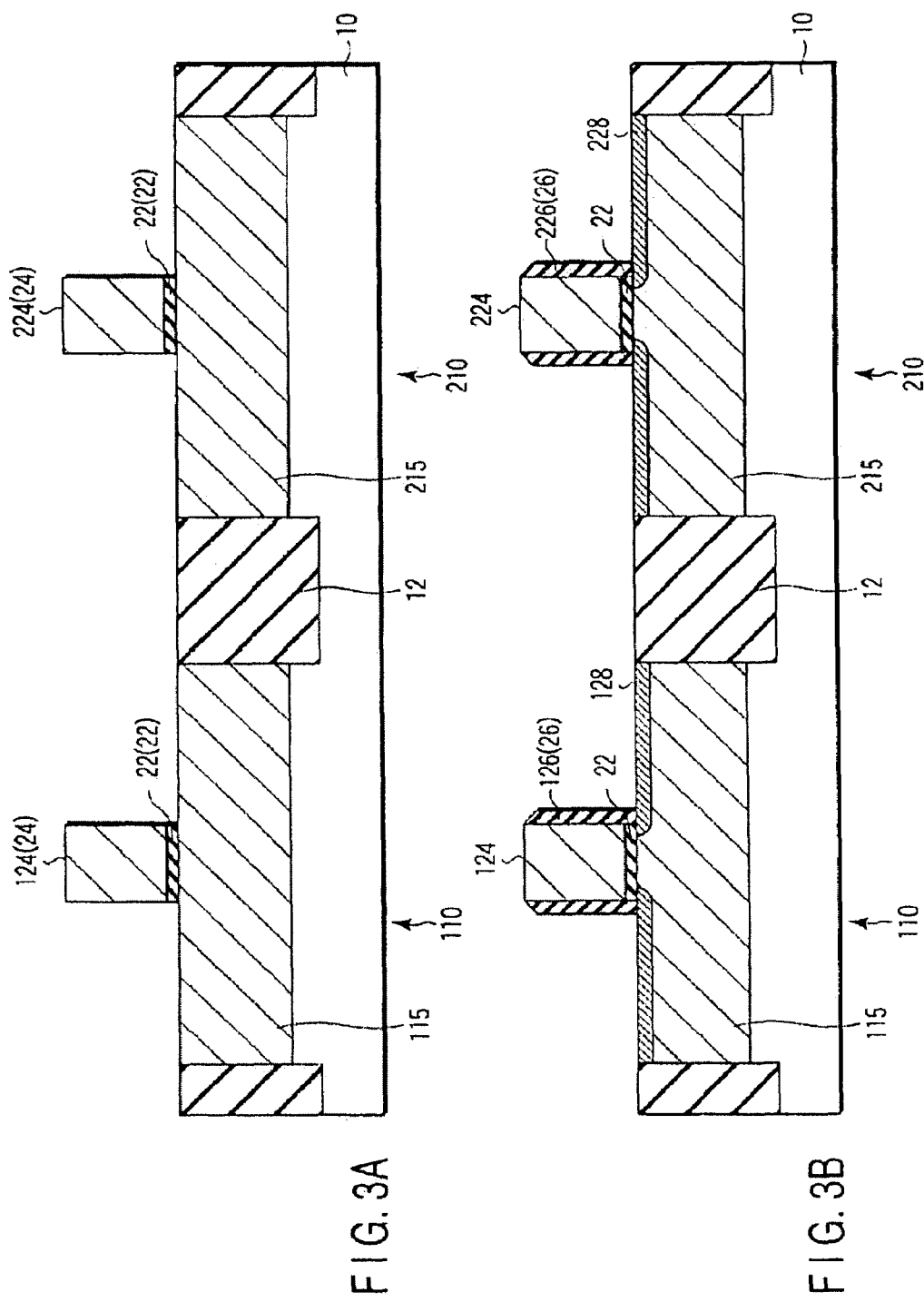

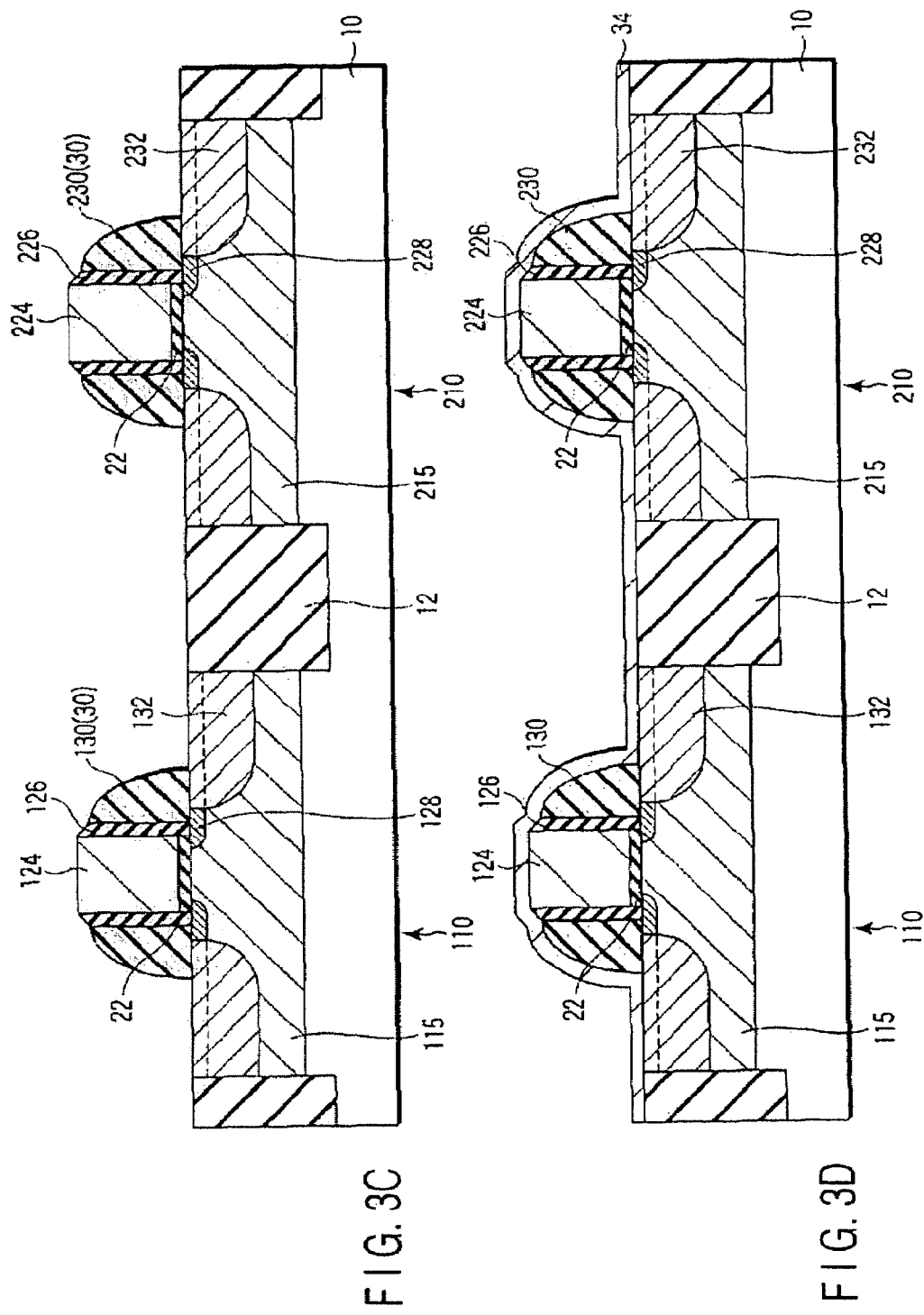

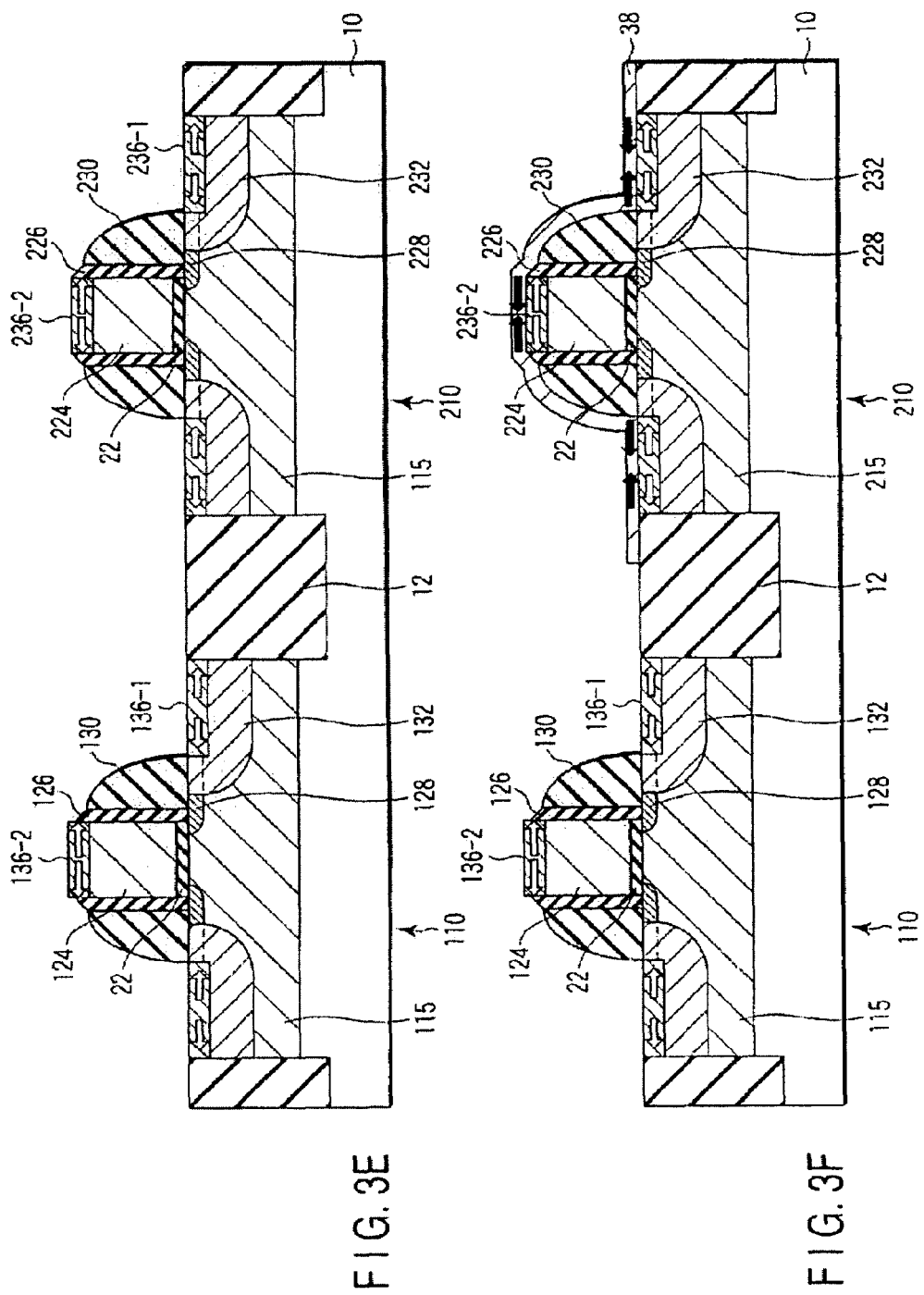

SEMICONDUCTOR DEVICE AND MANUFACTURING METHOD THEREOF

CROSS-REFERENCE TO RELATED APPLICATIONS

This application is based upon and claims the benefit of priority from prior Japanese Patent Application No. 2005-270773, filed Sep. 16, 2005, the entire contents of which are incorporated herein by reference.

BACKGROUND OF THE INVENTION

1. Field of the Invention

The present invention relates to a semiconductor device and a manufacturing method thereof, and more particularly to a semiconductor device using a silicide and a manufacturing method thereof.

2. Description of the Related Art

In a recent miniaturized semiconductor device, especially in a metal insulator semiconductor (MIS) type field effect transistor (FET) device, it has been demanded to improve characteristics of the semiconductor device, such as an increase in a speed and a reduction in power consumption. In order to increase the speed of the semiconductor device, it is required to improve a current driving force of an active component. In a conventional semiconductor device, the current driving force has been improved with a reduction in a gate length. However, a sufficient improvement in the current driving force cannot be expected by a simple reduction in the gate length with progress of miniaturization in recent years. Therefore, improving the current driving force by any alternative technique has been demanded, and there has been used, e.g., a technique which gives a stress to a channel region of an FET to enhance mobility of a carrier.

In a complimentary metal oxide semiconductor (CMOS) device, there has been known that a current driving force of the semiconductor device can be improved by applying stresses with opposite direction to respective channel regions in an n channel MOSFET (which will be referred to as an nMOS hereinafter) and a p channel MOSFET (which will be referred to as a pMOS hereinafter).

In a conventional CMOS semiconductor device, a silicide is formed on a surface of a source/drain contact region of each of the NMOS and the pMOS to reduce a parasitic resistance of the active device. As the silicide, there is used, e.g., titanium silicide ($TiSi_2$), cobalt silicide ($CoSi_2$), nickel silicide (NiSi) or the like. It is known that these silicides all have a tensile internal stress against silicon.

If this type of silicide is formed on the surface of the source/drain contact region of the MOSFET, a compressive stress is induced in the source and the drain (in the silicon substrate) immediately below the silicide, and a tensile stress is induced in the channel region of the MOSFET arranged beside the silicide. When the tensile stress is given to the channel region, in the nMOS, mobility of a carrier (electron) flowing through the channel enhances, which contributes to an improvement in a current driving force. However, in the pMOS, since a carrier flowing through the channel is a hole, and thus its mobility reduces. Accordingly, there arises a problem that a driving current is decreased in the pMOS. In order to enhance the mobility of the hole, a compressive stress must be applied to the channel of the pMOS.

Therefore, an improvement in the current driving force can be realized by giving a tensile stress to the channel region of the nMOS and the opposite compressive stress to that of the pMOS.

In a conventional salicide technology used to form a silicide, a direction of a stress induced in a silicon substrate is uniquely defined depending on a kind of silicide to be used. Therefore, if only one kind of silicide is used, a current driving force of one of the nMOS and the pMOS can be improved, but a current driving force of the remaining one is disadvantageously lowered. If a dual silicide structure using two kinds of silicides is adopted, stresses in desired directions can be given to both the nMOS and the pMOS, but there is another problem that a manufacturing process becomes very complicated.

In order to solve the problem, Jpn. Pat. Appln. KOKAI Publication No. 2003-60076 discloses a technology in which one type of silicide is formed in a source and a drain, then a first silicon nitride film (an $Si_3N_4$ film) having a tensile stress is formed on an nMOS region and a second $Si_3N_4$ film having a compressive stress is formed on a pMOS region. These $Si_3N_4$ films control the stresses induced in the nMOS and pMOS channel regions in opposite directions each other, thereby improving respective current driving forces. Since the first and second $Si_3N_4$ films are formed by different manufacturing methods, the manufacturing process becomes complicated. Further, there occurs a new problem, e.g., a problem of a stress in an interface region where the first and second $Si_3N_4$ films come into contact with each other.

BRIEF SUMMARY OF THE INVENTION

According to one aspect of the present invention, it is provided a semiconductor device comprising: a first semiconductor element device; and a second semiconductor element device, the first semiconductor element device comprising: a first gate electrode formed on a semiconductor substrate through an insulator; a pair of first diffusion layers formed in the semiconductor substrate with the first gate electrode therebetween; and a first conductor layer formed in the first diffusion layer and having an internal stress in a first direction, and the second semiconductor element device including: a second gate electrode formed on the semiconductor substrate through an insulator; a pair of second diffusion layers formed in the semiconductor substrate with the second gate electrode therebetween; and a second conductor layer formed in the second diffusion layer, having an internal stress in a second direction opposite to the first direction, and constituted of the same element as that of the first conductor layer.

According to another aspect of the present invention, it is provided a semiconductor device comprising: a first switching element device whose electrical conductivity is governed by a first carrier; a first conductive stress applying layer to apply a first stress to enhance mobility of the first carrier in the first switching element device; a second switching element device whose electrical conductivity is governed by a second carrier; and a second conductive stress applying layer to apply a second stress being opposite to the first stress to enhance mobility of the second carrier in the second switching element device, and constituted of the same element as that of the first conductive stress applying layer.

According to still another aspect of the present invention, it is provided a manufacturing method of a semiconductor device, comprising: forming first and second semiconductor regions in a semiconductor substrate; forming a first gate electrode on the first semiconductor region through an insulator, and forming a second gate electrode on the second semiconductor region through an insulator; forming a pair of first diffusion layers in the semiconductor substrate with the first gate electrode therebetween, and forming a pair of second diffusion layers in the semiconductor substrate with the second gate electrode therebetween; depositing a metal film on the first and second diffusion layers; forming first and second conductor layers with a first phase having an internal stress in a first direction in respective first and second diffusion layers by causing the metal film to react with the semiconductor substrate in a first annealing; forming a stress control film having an internal stress in a second direction opposite to the first direction on the second semiconductor region; and forming a first conductor layer with a second phase having an internal stress in the first direction in the first semiconductor region by a second annealing to manufacture a first semiconductor element device, and forming a second conductor layer with a second phase having an internal stress in the second direction in the second semiconductor region by the second annealing to manufacture a second semiconductor element device.

BRIEF DESCRIPTION OF THE SEVERAL VIEWS OF THE DRAWING

FIGS. 3A to 3G are cross-sectional views illustrating an example of a manufacturing process of a semiconductor device according to an embodiment of the present invention.

DETAILED DESCRIPTION OF THE INVENTION

Figure 1:
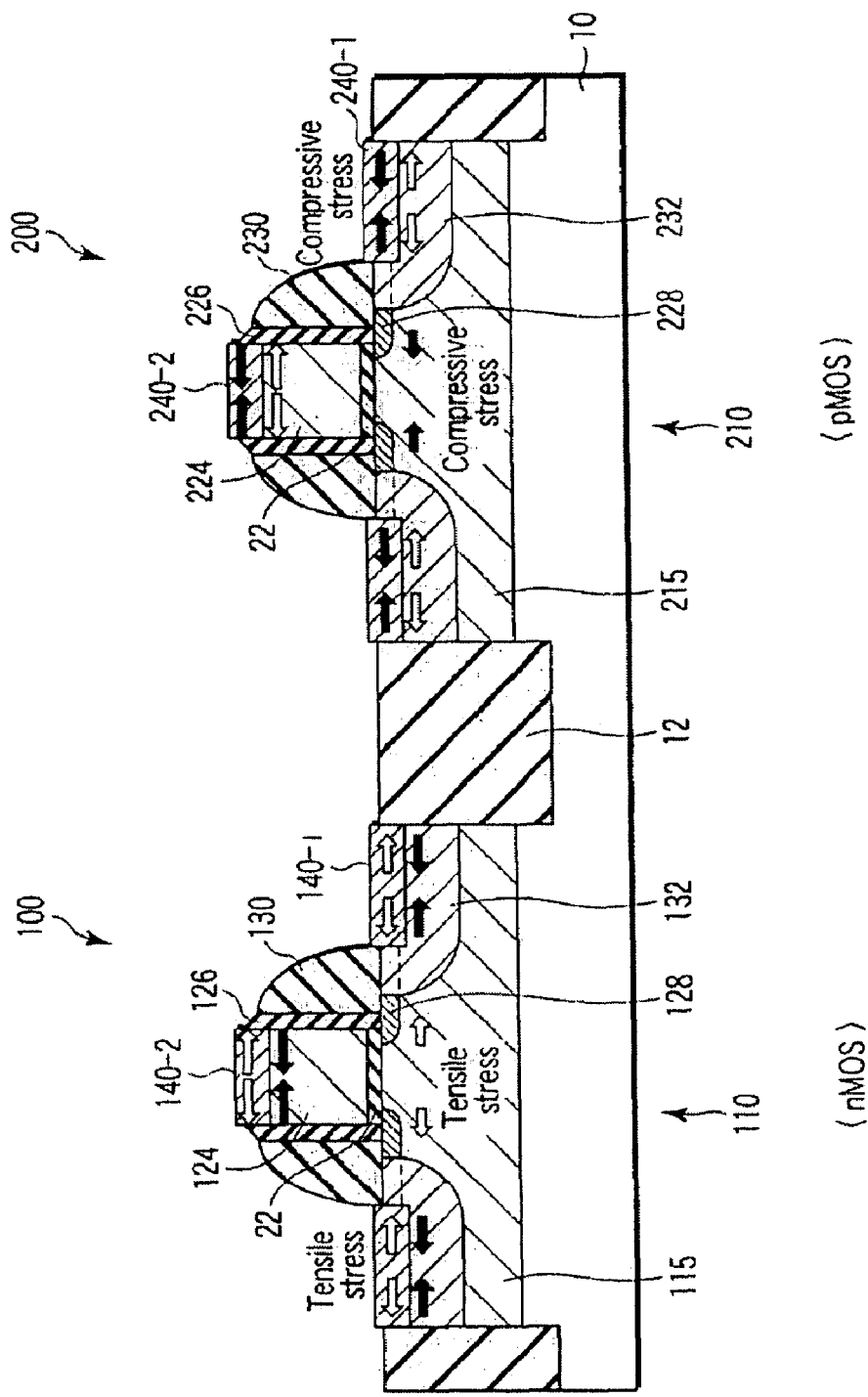
FIG. 1 is a cross-sectional view illustrating a semiconductor device according to an embodiment of the present invention.

The embodiments of the present invention will be described with reference to the accompanying drawings. Throughout the drawings, corresponding portions are denoted by corresponding reference numerals. Each of the following embodiments is illustrated as one example, and therefore the present invention can be variously modified and implemented without departing from the spirits of the present invention.

The present invention discloses a semiconductor device and a manufacturing method thereof which can improve characteristics of each of an nMOS and a pMOS even though miniaturization is effected.

According to the present invention, it is provided a semiconductor device comprising a silicide layer which gives a tensile stress to a channel region of the nMOS and another silicide layer which gives a compressive stress to a channel region of the pMOS, and a manufacturing method thereof. The silicide layers are of one kind of silicide constituted of the same element, and thus are different from a conventional dual silicide using two kinds of silicides.

FIG. 1 shows an example of a cross-sectional structure of a semiconductor device according to an embodiment of the present invention. Although the semiconductor device according to this embodiment has two types of silicide layers 140 and 240 constituted of the same element in an nMOS 100 and a pMOS 200, respectively, the silicide layers 140 and 240 are formed to have internal stresses with opposite directions each other in a salicide step of forming the silicide layers. A pair of arrows shown in the drawing represents the direction of the internal stress, and outward arrows indicate a tensile stress whilst inward arrows indicate a compressive stress.

In FIG. 1, in the nMOS 100, silicide layers 140-1 and 140-2 formed on a source/drain contact region 132 and a gate electrode 124 have a tensile internal stress. To make it easy to understand stresses induced in a silicon substrate 10 around the silicide, the fact that the silicide layer 140-1 has a tensile stress conceptually corresponds to that the silicide layer 140-1 having a volume smaller than that of the silicon substrate 10 is embedded therein. Accordingly, a compressive stress whose direction is opposite to the stress in the silicide layer 140-1 is induced in the silicon substrate 10 immediately below the silicide layer 140-1. While a tensile stress whose direction is the same as the stress in the silicide layer 140-1 is induced in a channel region which is sandwiched between the two silicide layers 140-1 and immediately below the gate electrode 124.

On the other hand, in the pMOS 200, silicide layers 240-1 and 240-2 formed on a source/drain contact region 232 and a gate electrode 224 have a compressive internal stress opposite to that of the nMOS 100. The fact that the silicide layer 240-1 has a compressive stress conceptually corresponds to that the silicide layer 240-1 having a volume larger than that of the silicon substrate 10 is embedded therein. Likewise, a compressive stress is induced in a channel region which is sandwiched between the two silicide layers 240-1 and immediately below the gate electrode 224 by the compressive stress of the silicide layer 240-1.

Therefore, mobility of electrons in the channel can be enhanced in the nMOS, and mobility of holes can be enhanced in the pMOS, thereby improving a current driving force of the semiconductor device.

To be described below in detail, the internal stresses of the silicide layers 140 and 240 of the NMOS and the pMOS can be independently induced in these layers to have opposite internal stresses in the salicide step of forming silicide layers.

Figure 2A:
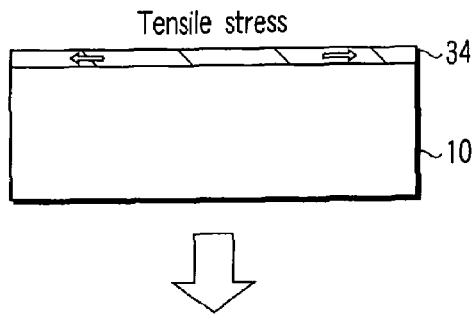
FIGS. 2A to 2E are cross-sectional views illustrating a mechanism of controlling stresses according to an embodiment of the present invention.
Figure 2B:
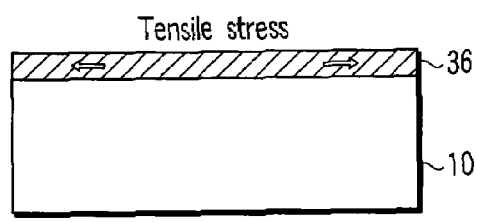

A basic concept inducing the stresses in the silicon substrate according to an embodiment of the present invention will now be described in detail with reference to cross-sectional views of FIGS. 2A to 2E. The semiconductor device according to this embodiment is manufactured through the salicide step including two stages of annealing for forming the silicide. First, as shown in FIG. 2A, a silicide metal film 34, e.g., nickel (Ni) is deposited on a surface of the silicon substrate 10 and a first silicidation annealing is performed. The first annealing is performed at a low temperature for a short time so that silicidation is not completely carried out. After the first annealing, the unreacted silicide metal film 34 is removed from the surface. A first phase silicide layer 36 is formed on the surface of the silicon substrate 10 by the first annealing as shown in FIG. 2B. The first phase silicide layer 36 is a silicide layer at an intermediate stage which has a non-stoichiometric composition of, e.g., $Ni_xSi$ ($1<x<2$), and has a tensile internal stress (the tensile stress is indicated by outward arrows in the drawing).

Figure 2C:
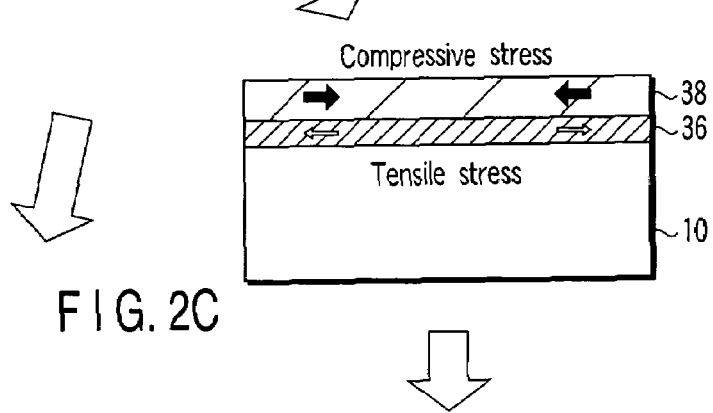

Then, as shown in FIG. 2C, a stress control film 38 having an internal stress opposite to that of the first phase silicide layer 36 (a compressive stress in the drawing) is formed on a surface of a part of the first phase silicide layer 36 (in the drawing, the compressive internal stress is indicated by inward arrows). The stress control film 38 is selected to have a larger internal stress than that in the first phase silicide layer 36 in an absolute value. In the example of FIG. 2C, as the stress control film 38, a titanium nitride film (TiN film) having a larger compressive stress is used.

Thereafter, a second silicidation annealing is performed. The second annealing is annealing whose thermal budget is larger than that of the first annealing, e.g., higher in an annealing temperature. During the second annealing, metals in the first phase silicide layer 36 completely react with silicon, thereby forming a second phase silicide layer 40. That is, the second phase silicide layer 40 is a stoichiometric silicide (e.g., mono-silicide) having a composition of, e.g., NiSi.

An internal stress of the second phase silicide layer 40 can be controlled depending on presence/absence of the stress control film 38 during the second annealing.

Figure 2D:
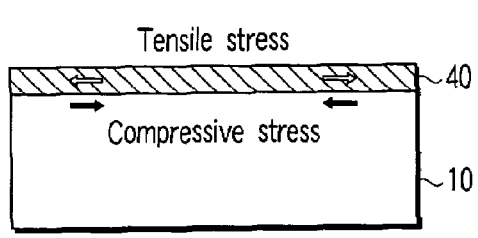

In a case where the second annealing is carried out without forming the stress control film 38, the second phase silicide layer 40 has far greater tensile internal stress than that in the first phase silicide layer 36 as shown in FIG. 2D.

Figure 2E:
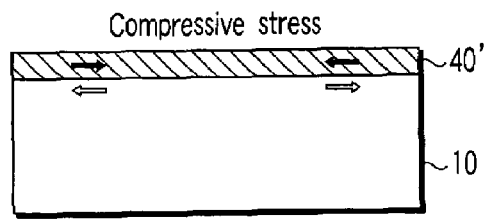

However, when the second annealing is performed with the stress control film 38 having a large compressive stress, as shown in FIG. 2E, the compressive stress is frozen in the silicide layer during the silicidation, thereby forming a second phase silicide layer 40' having a compressive stress.

In this manner, a direction of the internal stress in the silicide layer can be controlled.

An embodiment of a CMOS semiconductor device in which the present invention is applied will now be described. In order to enhance carrier mobility in a channel, a tensile stress must be given to the channel in an nMOS, while a compressive stress must be given to that in a pMOS. Thus, when forming a silicide having, e.g., a tensile stress primitively in a contact region of a source and a drain, the second annealing is carried out in a state where a stress control film 38 having, e.g., a large compressive stress is formed in the pMOS alone. As a result, a compressive internal stress is frozen in a silicide layer formed in the contact region of the pMOS, and a tensile internal stress is induced in a silicide layer of the NMOS. Therefore, a compressive stress can be given to the channel region in the pMOS, and a tensile stress can be given in that of the nMOS. That is, the silicide layers having opposite internal stresses can be simultaneously formed.

Forming the silicide layers having the opposite internal stresses as described above can enhance carrier mobility in the channel regions in the nMOS and the pMOS, respectively. Specifically, mobility of electrons in the channel of the nMOS can be enhanced by giving the tensile stress to the channel region, and mobility of holes in the channel of the pMOS can be enhanced by giving the compressive stress to the channel region. As a result, the current driving force of each of the nMOS and the pMOS can be improved. Furthermore, the above described silicide layer reduces a parasitic resistance of a source and a drain, which is a primary purpose of the silicide layers. Accordingly, the current driving force of the CMOS semiconductor device can be improved with respect to each of the nMOS and the pMOS, thereby enhancing device performance. Moreover, as described above, the present invention can be realized by just adding the stress control film in the salicide step, thus the manufacturing process is simple.

An example of the manufacturing process of this embodiment will now be described hereinafter with reference to process cross-sectional views of FIGS. 3A to 3G.

(1) First, referring to FIG. 3A, an isolation 12 is formed in a semiconductor substrate 10, e.g., a silicon substrate. For the isolation 12, it can be used, e.g., a shallow trench isolation (STI) which is obtained by forming a shallow groove in the silicon substrate 10 and filling the groove with a silicon oxide film (SiO$_2$ film) formed by chemical vapor deposition (CVD).

Then, a p-type impurity is deeply doped in an nMOS region 110 where an nMOS is being formed to constitute a p-well 115, and an n-type impurity is deeply doped in a pMOS region 210 where a pMOS is being formed to constitute an n-well 215. It can be used, e.g., boron (B) as the p-type impurity and used, e.g., phosphorous (P) as the n-type impurity.

Then, a gate insulator 22 is formed on the entire surface, and a conductor film 24 is deposited thereon. As the gate insulator 22, it can be used, e.g., SiO$_2$ film or a silicon oxynitride film (SiON film). Polycrystal silicon in which phosphorous or boron is doped with a high concentration or not doped can be used for the conductor film 24, for example.

Further, the laminated film of the gate insulator 22 and the conductor film 34 is patterned by lithography and etching to form gate electrodes 124 and 224.

(2) Then, a first insulator 26 is formed on the entire surface over the gate electrodes 124 and 224. A silicon nitride film (Si3N4 film) having a film thickness of, e.g., 2 to 10 nm, can be used as the first insulator 26, for example. The first insulator 26 is subjected to anisotropic etching to leave the first insulator 26 only on side surfaces of the gate electrodes 124 and 224, thereby forming offset spacers 126 and 226, as shown in FIG. 3B. Ion implantation is carried out with the gate electrodes 124 and 224 and the offset spacers 126 and 226 being used as masks. An n-type impurity, e.g., arsenic (As) is doped in the nMOS region 110 to form a first diffusion layer 128, and a p-type impurity, e.g., boron is doped in the pMOS region 210 to form a second diffusion layer 228. The first and second diffusion layers 128 and 228 serve as extensions of a source and a drain.

(3) Then, a second insulator 30 is formed on the entire surface to cover the gate electrodes 124 and 224 including the offset spacers 126 and 226. As the second insulator 30, it can be used, e.g., Si3N4 film. The second insulator 30 is subjected to anisotropic etching to leave the second insulator 30 only on side surfaces of the offset spacers 126 and 226, thereby forming gate sidewalls 130 and 230, as shown in FIG. 3C. An ion implantation is carried out to be deeper and higher concentration than those in the first and second diffusion layers with the gate electrodes 124 and 224 and the gate sidewalls 130 and 230 being used as masks. An n-type impurity, e.g., arsenic is doped in the nMOS region 110 to form a third diffusion layer 132, and a p-type impurity, e.g., boron is doped in the pMOS region 210 to form a fourth diffusion layer 232. The third and fourth diffusion layers 132 and 232 serve as contact regions of the source and the drain.

Dopants are also introduced in the gate electrodes 124 and 224 at the same time during the ion implantations of the first and third diffusion layers 128 and 132 and the second and fourth diffusion layers 228 and 232 at the steps (2) and (3), respectively.

(4) Then, as shown in FIG. 3D, a silicide metal film 34 is formed over the entire surface of the gate electrodes 124 and 224. As the silicide metal 34, it can be used, e.g., nickel (Ni), cobalt (Co), titanium (Ti) or the like having a film thickness of approximately 10 nm.

(5) Subsequently, first silicidation annealing is carried out. The first silicidation annealing is an annealing which is carried out at a low temperature for a short time, e.g., a rapid thermal annealing (RTA) at approximately 350° C., so that silicidation is not completely performed. By the first annealing, as shown in FIG. 3E, silicon being in contact with the silicide metal film 34 is reacted, thereby forming first phase silicide layers 136-1 and 236-1 and 136-2 and 236-2 on upper surfaces of the source/drain contact regions 132 and 232 and the gate electrodes 124 and 224, respectively. If Ni is used as the silicide metal 34, then the first phase silicide layer is an intermediate nickel silicide having a non-stoichiometric composition of, e.g., $Ni_xSi$ ($1<x<2$). This silicide layer has a tensile internal stress as indicated by outward arrows in the drawing. During the first annealing, the silicide metal deposited on the isolation 12 or the gate sidewalls 130 and 230 of the $Si_3N_4$ film is not reacted with them, and hence no silicide layer is formed thereon.

Thereafter, the unreacted silicide metal, e.g., the Ni film is etched and removed by using an etchant such as a mixture of sulfuric acid and hydrogen peroxide or a mixture of ammonia water and hydrogen peroxide. In the etching, the first phase silicide layers 136 and 236 remain without being etched by such an etchant.

(6) Next, as shown in FIG. 3F, a stress control film 38 is formed over the entire surface of the gate electrodes 124 and 224. Then, the stress control film 38 on the NMOS region 110 is removed by lithography and etching, and the pMOS region 210 alone is capped with the stress control film 38. The stress control film 38 is a film having an internal stress which is opposite to those in the first phase silicide layers 136 and 236 and has a larger absolute internal stress value than those. If the first phase silicide layer is, e.g., $Ni_xSi$ ($1<x<2$) having a tensile stress, it can be used a film having a compressive stress (inward arrows in the drawing), e.g., a titanium nitride film (TiN film). A hydrogen peroxide solution ($H_2O_2$) can be used for selective etching the TiN film 38, for example.

Figure 3G:
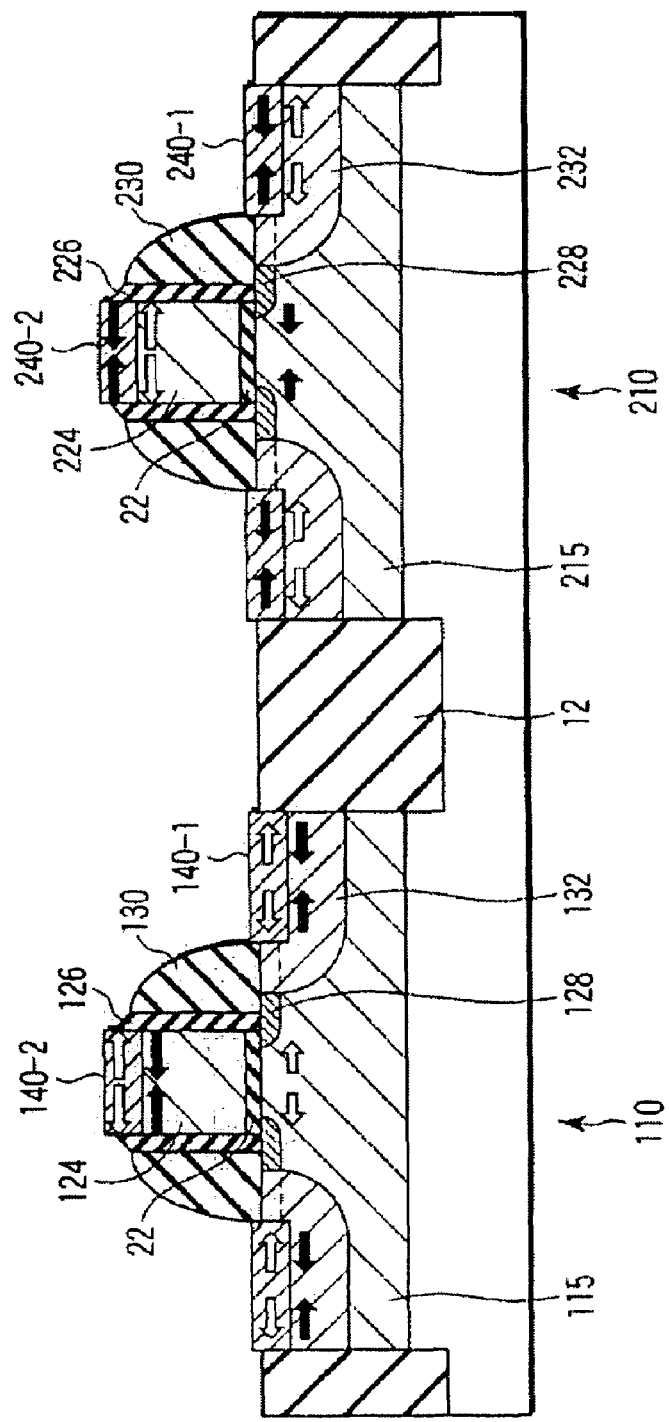

(7) Then, a second silicide annealing is performed. The second annealing is carried out to case the first phase silicide layers 136 and 236 to completely react with silicon. For example, the second annealing is RTA at approximately 500° C., and its thermal budget is larger than that of the first annealing. As shown in FIG. 3G, by the second annealing, the first phase silicide layers 136 and 236 (e.g., $Ni_xSi$ ($1<x<2$)) change to second phase silicide layers 140 and 240 having a stoichiometric composition (e.g., nickel monosilicide (NiSi)).

Since the stress control film 38, e.g., TiN film, used in the above step is a stable film, it does not react with silicide layers in the annealing. Therefore, both the silicide layers 140 and 240 of the nMOS and the PMOS are constituted of the same element.

The thus formed silicide layers 140 and 240 of the nMOS and the pMOS have internal stresses opposite each other. That is, in the nMOS 100 where the second annealing has been performed without forming the stress control film 38, the second phase silicide layer 140 has a tensile internal stress which is far greater absolute stress value than that of the first phase silicide layer 136. However, in the pMOS 200 where the second annealing has been carried out with the stress control film 38 having a large compressive stress formed thereon, the compressive stress is frozen in the silicide layer 240 during silicidation reaction, and hence second phase silicide layers 240-1 and 240-2 having compressive internal stresses are formed.

After the second annealing, the stress control film 38 is removed to bring the structure shown in FIG. 3G to completion.

Then, although not shown, wiring lines connected with the silicide layers 140-1 and 240-1 on the third and fourth diffusion layers 132 and 232 and the silicide layers 140-2 and 240-2 on the gate electrodes 124 and 224 are formed, respectively. Additionally, processes required for the semiconductor device, e.g., multilevel wiring, are carried out, thereby completing the CMOS semiconductor device in which the stresses in the respective silicide layers of the nMOS and the pMOS are controlled to have in desired directions and the characteristics of the devices are improved.

During the second annealing, as described above, in the pMOS region 210 capped with the stress control film 38 having the internal stress opposite to the stress of the original silicide layer, the second phase silicide layers 240-1 and 240-2 formed therein are formed to have internal stresses with the same direction as that of the stress control film 38. On the other hand, in the NMOS region 110, the second phase silicide layers 140-1 and 140-2 are formed to have original tensile internal stresses.

In addition, a second stress control film can be formed on the nMOS region 110 to increase the internal stress in the silicide layers 140-1, 140-2 in the nMOS. The second stress control film has an internal stress in the same direction with that in the silicide layers 140-1, 140-2 in the MOS.

In the pMOS where the silicide layer 240-1 has the compressive internal stress, the compressive stress is also given to an adjacent channel region. Likewise, in the NMOS where the silicide layer 140-1 has the tensile internal stress, the tensile stress is also given to an adjacent channel region.

Each silicide, i.e., nickel silicide (NiSi), cobalt silicide ($CoSi_2$) or titanium silicide ($TiSi_2$) formed from the silicide metal, e.g., nickel (Ni), cobalt (Co) or titanium (Ti) essentially has a tensile internal stress. Therefore, the TiN film having a large compressive stress can be used as the stress control film to control the stresses in opposite directions in the pMOS and the NMOS.

In this embodiment, nickel silicide (NiSi) has been taken as an example of the silicide material, but the present invention is not limited to such a material. As the silicide material, it can be used various kinds of metal silicides, e.g., platinum silicide (PtSi), palladium silicide (PdSi) and erbium silicide ($ErSi_2$), in addition to $TiSi_2$ and $CoSi_2$ mentioned above.

Further, although the titanium nitride film having a compressive internal stress has been taken as an example of the material for a stress control film to the silicide layer, the material is not limited to the titanium nitride film, and it can be likewise used any other conductor film, a semiconductor film or an insulator film having an internal stress opposite to that of the silicide layer.

In this embodiment, the titanium nitride film having a compressive internal stress is deposited on the pMOS region alone before silicidation by the second annealing. In addition, a second stress control film having a large tensile internal stress can be deposited on the nMOS region to form a silicide layer to have a larger tensile internal stress. As a result, further increasing the tensile stress given to the channel region can improve performance of the nMOS. It is to be noted that these stress control films are removed after the second silicidation annealing.

As described above, forming the silicide layers having the internal stresses opposite to each other can enhance carrier mobility in the channel region in each of the nNOS and the pMOS. That is, mobility of electrons in the channel region of nMOS can be enhanced by giving the tensile stress thereto, and mobility of holes in the channel region of the pMOS can be enhanced by giving the compressive stress thereto. Thus, the current driving force of each of the nMOS and the PMOS can be improved. Furthermore, each of the above-described silicide layers reduces a parasitic resistance of the source/drain, which is an original purpose of the silicide layer. As a result, the current driving force of a CMOS semiconductor device can be improved with respect to each of the nMOS and pMOS, thereby improving device performance. Moreover, the present invention can be achieved by just adding formation of the stress control film in the salicide process, therefore the manufacturing process is simple.

The present invention is effective for improving performance of a miniaturized semiconductor device, and more particularly, can improve performance of a CMOS semiconductor device whose gate length is not greater than 0.1 µm.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first semiconductor element device; and
   a second semiconductor element device,
   the first semiconductor element device comprising:
      a first gate electrode formed on a semiconductor substrate through an insulator;
      a pair of first diffusion layers formed in the semiconductor substrate with the first gate electrode therebetween; and
      a first conductor layer formed in the first diffusion layer and having an internal stress in a first direction, and
   the second semiconductor element device including:
      a second gate electrode formed on the semiconductor substrate through an insulator;
      a pair of second diffusion layers formed in the semiconductor substrate with the second gate electrode therebetween; and
      a second conductor layer formed in the second diffusion layer, having an internal stress in a second direction opposite to the first direction, and constituted of the same element as that of the first conductor layer,
   wherein the internal stress in one of the first and second conductor layers is a stress frozen in the conductor layer by an annealing, having the same direction as an internal stress of a stress control film, and having an opposite direction to an original internal stress of the conductor layer.

2. The semiconductor device according to claim 1, wherein the first semiconductor element device is an nMOSFET, the internal stress in the first direction is a tensile stress, the second semiconductor element device is a pMOSFET, and the internal stress in the second direction is a compressive stress.

3. The semiconductor device according to claim 1, wherein each of the first and second conductor layer is a metal silicide containing at least one of nickel, cobalt, titanium, platinum, palladium and erbium.

4. The semiconductor device according to claim 1, wherein the internal stresses in the first and second directions are simultaneously formed when the first and second conductor layers are formed.

5. The semiconductor device according to claim 1, wherein the stress control film is a metal nitride.

6. The semiconductor device according to claim 1, wherein each of the first and second conductor layers is nickel silicide, and the stress control film is titanium nitride.

7. A semiconductor device comprising:
   a first switching element device whose electrical conductivity is governed by a first carrier;
   a first conductive stress applying layer to apply a first stress to enhance mobility of the first carrier in the first switching element device;
   a second switching element device whose electrical conductivity is governed by a second carrier; and
   a second conductive stress applying layer to apply a second stress being opposite to the first stress to enhance mobility of the second carrier in the second switching element device, and constituted of the same element as that of the first conductive stress applying layer,
   wherein one of the first stress and second stress is a stress frozen in the conductor stress applying layer by an annealing, having the same direction as an internal stress of a stress control film, and having an opposite direction to an original internal stress of the conductor stress applying layer.

8. The semiconductor device according to claim 7, wherein the first carrier is electrons, the first stress is a tensile stress, the second carrier is holes, and the second stress is a compressive stress.

9. The semiconductor device according to claim 7, wherein the first and second stresses in the first and second conductive stress applying layers are simultaneously formed when the first and second conductive stress applying layers are formed.

* * * * *